(12) United States Patent
Hafez et al.

(10) Patent No.: US 10,847,544 B2
(45) Date of Patent: Nov. 24, 2020

(54) HIGH VOLTAGE THREE-DIMENSIONAL DEVICES HAVING DIELECTRIC LINERS

(71) Applicant: Intel Corporation, Santa Clara, CA (US)

(72) Inventors: Walid M. Hafez, Portland, OR (US); Jeng-Ya D. Yeh, Portland, OR (US); Curtis Tsai, Beaverton, OR (US); Joodong Park, Portland, OR (US); Chia-Hong Jan, Portland, OR (US); Gopinath Bhimarasetti, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/931,881

(22) Filed: May 14, 2020

(65) Prior Publication Data
US 2020/0273887 A1 Aug. 27, 2020

Related U.S. Application Data

(60) Continuation of application No. 15/946,666, filed on Apr. 5, 2018, now Pat. No. 10,692,888, which is a (Continued)

(51) Int. Cl.
*H01L 27/12* (2006.01)
*H01L 29/51* (2006.01)
(Continued)

(52) U.S. Cl.
CPC ...... *H01L 27/1211* (2013.01); *H01L 21/0228* (2013.01); *H01L 21/02164* (2013.01);
(Continued)

(58) Field of Classification Search
CPC .......... H01L 27/1211; H01L 29/66545; H01L 21/823437; H01L 29/42356; H01L 29/51;
(Continued)

(56) References Cited

U.S. PATENT DOCUMENTS 7,358,121 B2    4/2008  Chau et al.
2004/0031988 A1 2/2004  Shukuri
(Continued)

FOREIGN PATENT DOCUMENTS

KR   10-2011-0111743   10/2011
TW       200414538    8/2004
TW       200843111   11/2008

OTHER PUBLICATIONS

International Search Report and Written Opinion of the International Searching Authority dated Dec. 10, 2013, in International Patent Application No. PCT/US2013/044363 9 pgs.
(Continued)

*Primary Examiner* — Mouloucoulaye Inoussa
(74) *Attorney, Agent, or Firm* — Schwabe, Williamson & Wyatt, P.C.

(57) ABSTRACT

High voltage three-dimensional devices having dielectric liners and methods of forming high voltage three-dimensional devices having dielectric liners are described. For example, a semiconductor structure includes a first fin active region and a second fin active region disposed above a substrate. A first gate structure is disposed above a top surface of, and along sidewalls of, the first fin active region. The first gate structure includes a first gate dielectric, a first gate electrode, and first spacers. The first gate dielectric is composed of a first dielectric layer disposed on the first fin active region and along sidewalls of the first spacers, and a second, different, dielectric layer disposed on the first dielectric layer and along sidewalls of the first spacers. The semiconductor structure also includes a second gate struc-
(Continued)

ture disposed above a top surface of, and along sidewalls of, the second fin active region. The second gate structure includes a second gate dielectric, a second gate electrode, and second spacers. The second gate dielectric is composed of the second dielectric layer disposed on the second fin active region and along sidewalls of the second spacers.

20 Claims, 11 Drawing Sheets

Related U.S. Application Data continuation of application No. 15/784,318, filed on Oct. 16, 2017, now Pat. No. 9,972,642, which is a division of application No. 14/975,645, filed on Dec. 18, 2015, now Pat. No. 9,806,095, which is a continuation of application No. 14/641,117, filed on Mar. 6, 2015, now Pat. No. 9,570,467, which is a division of application No. 13/536,732, filed on Jun. 28, 2012, now Pat. No. 8,981,481.

(51) Int. Cl.
*H01L 21/84* (2006.01)
*H01L 29/66* (2006.01)
*H01L 21/8234* (2006.01)
*H01L 21/02* (2006.01)
*H01L 21/28* (2006.01)
*H01L 29/423* (2006.01)

(52) U.S. Cl.
CPC .. *H01L 21/02532* (2013.01); *H01L 21/02598* (2013.01); *H01L 21/28158* (2013.01); *H01L 21/823412* (2013.01); *H01L 21/823418* (2013.01); *H01L 21/823431* (2013.01); *H01L 21/823437* (2013.01); *H01L 21/823462* (2013.01); *H01L 21/823468* (2013.01); *H01L 21/845* (2013.01); *H01L 29/42356* (2013.01); *H01L 29/51* (2013.01); *H01L 29/513* (2013.01); *H01L 29/6656* (2013.01); *H01L 29/6681* (2013.01); *H01L 29/66545* (2013.01)

(58) Field of Classification Search
CPC ..... H01L 21/823412; H01L 21/823418; H01L 29/6681; H01L 21/823462; H01L 21/02164; H01L 21/0228; H01L 21/02532; H01L 21/02598; H01L 21/28158; H01L 21/845; H01L 21/823468; H01L 21/823431; H01L 29/6656; H01L 29/513; H01L 27/108; H01L 27/10802; H01L 27/10826; H01L 27/1203; H01L 29/7841; H01L 29/785; H01L 29/66477; H01L 29/07; H01L 27/0886; H01L 29/42364; H01L 29/66795
See application file for complete search history.

(56) References Cited

U.S. PATENT DOCUMENTS

| | | |
|---|---|---|
| 2004/0036127 A1 | 2/2004 | Chau et al. |
| 2005/0014352 A1 | 1/2005 | Torii et al. |
| 2005/0019993 A1 | 1/2005 | Lee et al. |
| 2005/0148137 A1 | 7/2005 | Brask et al. |
| 2007/0090443 A1 | 4/2007 | Choi et al. |
| 2008/0128757 A1 | 6/2008 | Chae et al. |
| 2008/0149984 A1 | 6/2008 | Chang et al. |
| 2008/0160684 A1 | 7/2008 | Kang et al. |
| 2009/0078997 A1 | 3/2009 | Greene et al. |
| 2009/0095980 A1 | 4/2009 | Yu et al. |
| 2009/0283837 A1 | 11/2009 | Huebinger et al. |
| 2010/0059833 A1 | 3/2010 | Yu et al. |
| 2010/0078711 A1 | 4/2010 | Goldbach et al. |
| 2011/0127610 A1 | 6/2011 | Lee et al. |
| 2011/0215415 A1 | 9/2011 | Gerhardt et al. |
| 2012/0043609 A1* | 2/2012 | Hafez .............. H01L 29/7816 257/337 |
| 2014/0001575 A1* | 1/2014 | Adams .............. H01L 27/1211 257/412 |

OTHER PUBLICATIONS

International Preliminary Report on Patentability from PCT/US2013/044363 dated Jan. 8, 2015, 6 pgs.
Office Action and Search Report for Taiwanese Patent Application No. 102120901, dated Feb. 25, 2016, 18 pgs.
Notice of Allowance for Taiwan Patent Application No. 102120901, dated Oct. 20, 2016, 2 pages.
Non-Final Office Action and Search Report for Taiwanese Patent Application No. 105116272 dated Jan. 11, 2017, 5 pgs., English Translation.
Notice of Allowance for Taiwan Patent Application No. 102120901, dated Oct. 17, 2017, 2 pages.
Office Action for Taiwan Patent Application No. 106139962, dated Sep. 17, 2018, 6 pgs.
Office Action for Taiwan Patent Application No. 108111973, dated Feb. 20, 2020, 5 pgs.
Non-Final Office Action for U.S. Appl. No. 14/641,117, dated Aug. 7, 2015, 7 pages.
Final Office Action for U.S. Appl. No. 14/641,117, dated Jan. 5, 2016, 7 pages.
Non-Final Office Action for U.S. Appl. No. 14/641,117, dated May 27, 2016, 9 pages.
Non-Final Office Action for U.S. Appl. No. 13/536,732, dated Feb. 11, 2014, 11 pages.
Final Office Action from U.S. Appl. No. 13/536,732 dated Jul. 1, 2014, 13 pgs.
Non-Final Office Action for U.S. Appl. No. 14/975,645 dated Feb. 9, 2017, 15 pgs.
Notice of Allowance for U.S. Appl. No. 15/784,318 dated Jan. 8, 2018, 10 pages.

* cited by examiner

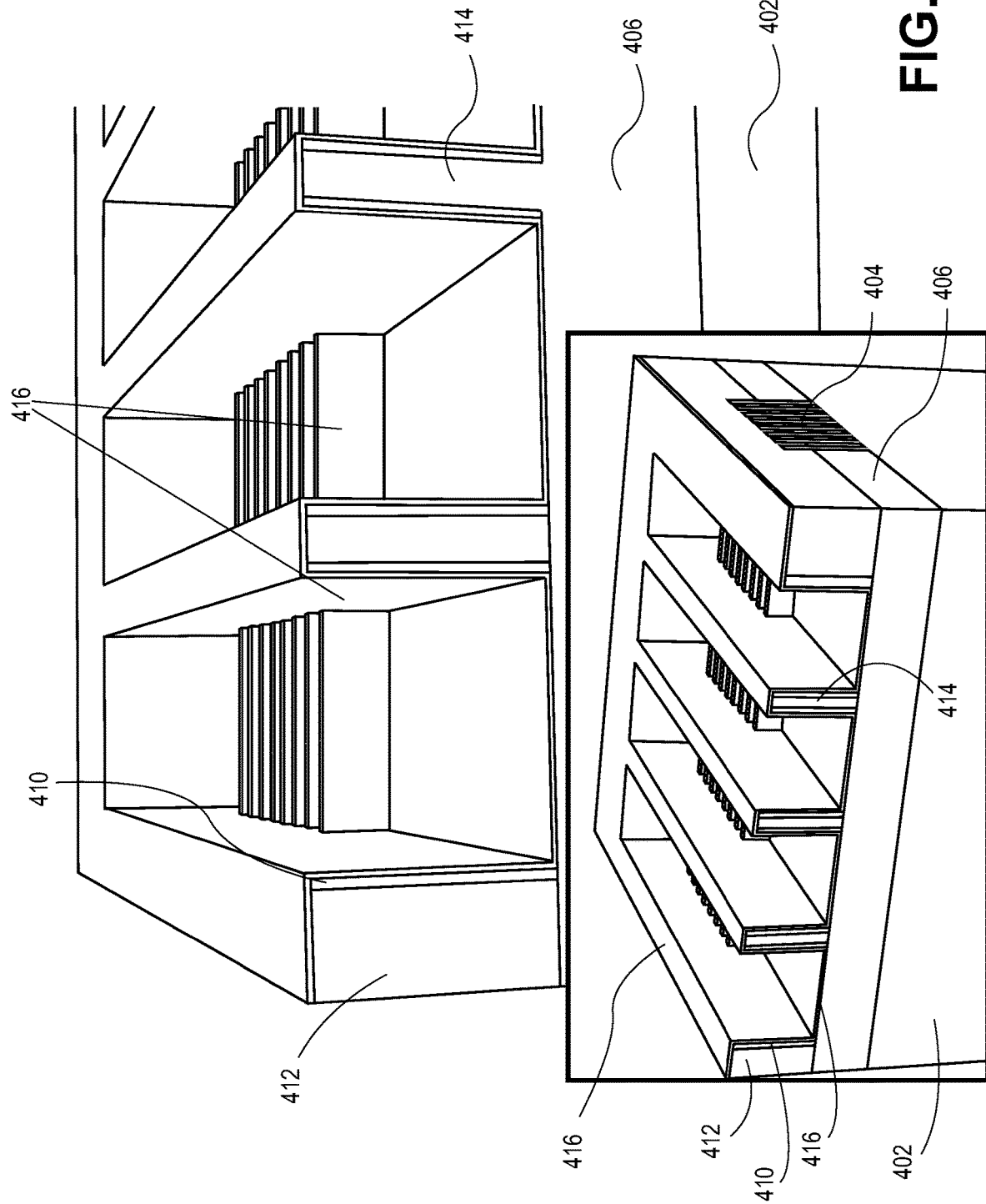

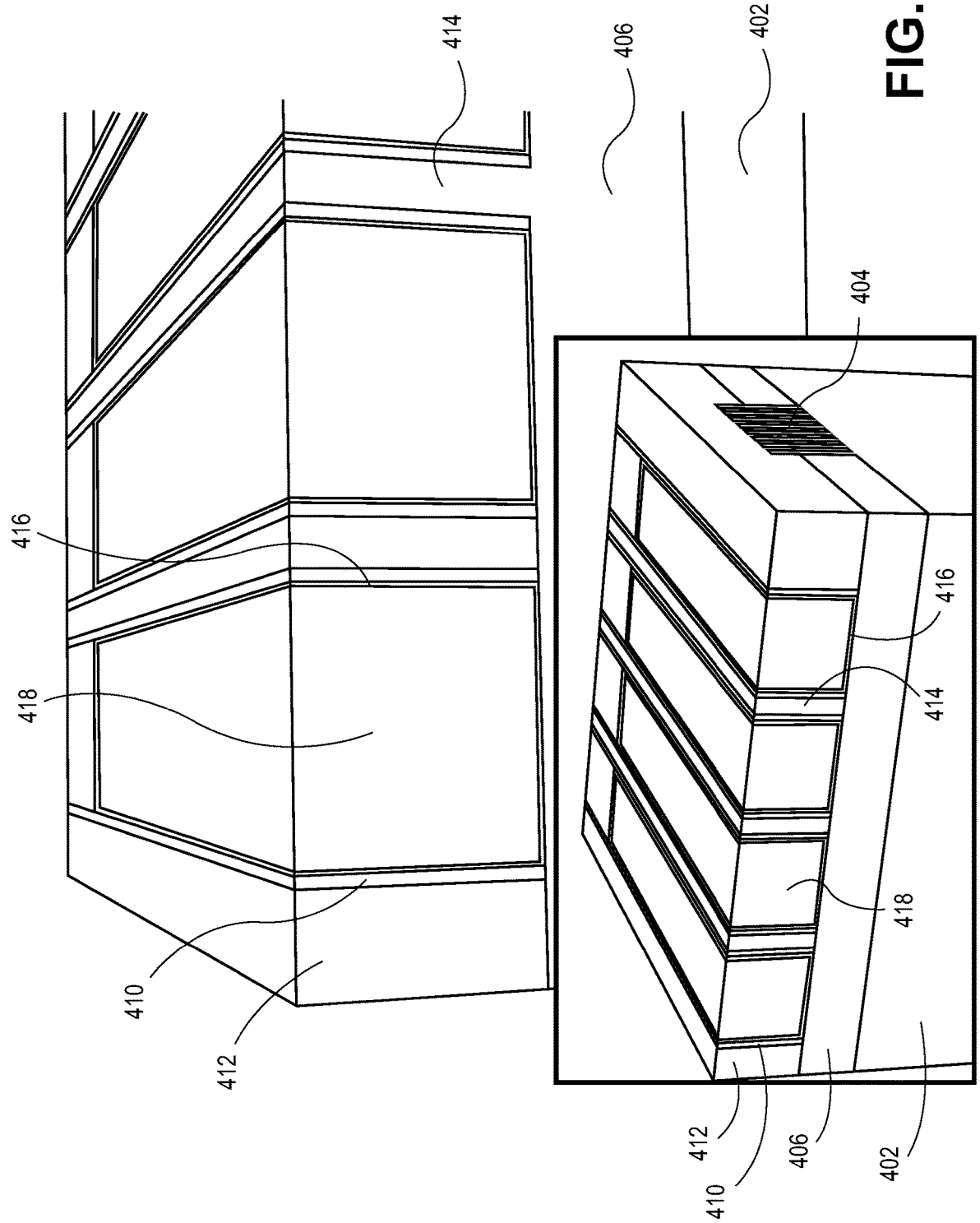

HIGH VOLTAGE THREE-DIMENSIONAL DEVICES HAVING DIELECTRIC LINERS

CROSS-REFERENCE TO RELATED APPLICATIONS

This application is a continuation of U.S. patent application Ser. No. 15/946,666, filed Apr. 5, 2018, which is a continuation of U.S. patent application Ser. No. 15/784,318, filed Oct. 16, 2017, now U.S. Pat. No. 9,972,642 issued May 15, 2018, which is a divisional of U.S. patent application Ser. No. 14/975,645, filed Dec. 18, 2015, now U.S. Pat. No. 9,806,095, issued Oct. 31, 2017, which is a continuation of U.S. patent application Ser. No. 14/641,117, filed Mar. 6, 2015, now U.S. Pat. No. 9,570,467, issued Feb. 14, 2017, which is a divisional of U.S. patent application Ser. No. 13/536,732, filed Jun. 28, 2012, now U.S. Pat. No. 8,981,481, issued Mar. 17, 2015, the entire contents of which are hereby incorporated by reference herein.

TECHNICAL FIELD

Embodiments of the invention are in the field of semiconductor devices and processing and, in particular, high voltage three-dimensional devices having dielectric liners and methods of forming high voltage three-dimensional devices having dielectric liners.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In other instances, silicon-on-insulator substrates are preferred because of the improved short-channel behavior of tri-gate transistors.

Scaling multi-gate transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 4A-4F illustrate cross-sectional views representing various operations in a method of fabricating a semiconductor structure, in accordance with an embodiment of the present invention, with:

FIG. 4A illustrating a starting structure including a plurality of fins formed above a substrate 402;

FIG. 4B illustrating a plurality of dummy gate structures formed orthogonal to the plurality of fins of FIG. 4A;

FIG. 4C illustrating contacts and/or isolation regions formed between gates of the plurality of dummy gate structures of FIG. 4B;

FIG. 4D illustrating removal of the plurality of dummy gates, leaving the contacts of FIG. 4C and the plurality of fins of FIG. 4A exposed;

FIG. 4E illustrating forming of an inside spacer dielectric liner conformal to the structure of FIG. 4D; and FIG. 4F illustrating forming of a plurality of permanent gate electrodes on or above the inside spacer dielectric liner of FIG. 4E.

DESCRIPTION OF THE EMBODIMENTS

High voltage three-dimensional devices having dielectric liners and methods of forming high voltage three-dimensional devices having dielectric liners are described. In the following description, numerous specific details are set forth, such as specific integration and material regimes, in order to provide a thorough understanding of embodiments of the present invention. It will be apparent to one skilled in the art that embodiments of the present invention may be practiced without these specific details. In other instances, well-known features, such as integrated circuit design layouts, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to the formation of, or structures including, dielectric liners to enable fabrication of high voltage transistors on aggressively scaled three-dimensional device architectures, such as aggressively scaled fin field-effect transistor (finFET) architectures. For example, a gate aligned contact process flow fabricated on three-dimensional semiconductor bodies may leave little to no margin for device breakdown. As such, substrate silicon consumption to form a thick gate dielectric layer may no longer be a viable option for forming gate dielectric layers for such high voltage devices.

One or more embodiments described herein may address issues surrounding enablement of a dual-voltage technology on an aggressively scaled non-planar (e.g., three-dimensional) transistor architecture. As Moore's law dictates, a gate pitch should be scaled by a factor of approximately 0.7 each generation in order to meet transistor density requirements. A result of such pitch scaling may be that isolation thickness between a gate contact and source/drain contacts is reduced each generation. System-on-chip (SoC) technologies typically rely on utilizing multiple voltage rails to enable a needed collateral, particularly if analog and/or RF communication features are present. However, conventional fabrication approaches may not be able to support such high voltages on highly scaled process technologies.

More specifically, high voltage transistors on aggressively scaled technologies may undergo premature device failure between the gate and source/drain contact, rather than the desirable gate to substrate mechanism. Such premature failure may result from the proximity of the gate to contact separation as well as, possibly, poor insulator qualities of an isolating spacer material. As an example of the concepts involved, FIG. 1 illustrates cross-sectional views of (A) a standard high voltage transistor 100A and (B) a scaled high voltage transistor 100B, in accordance with an embodiment of the present invention.

Figure 1:
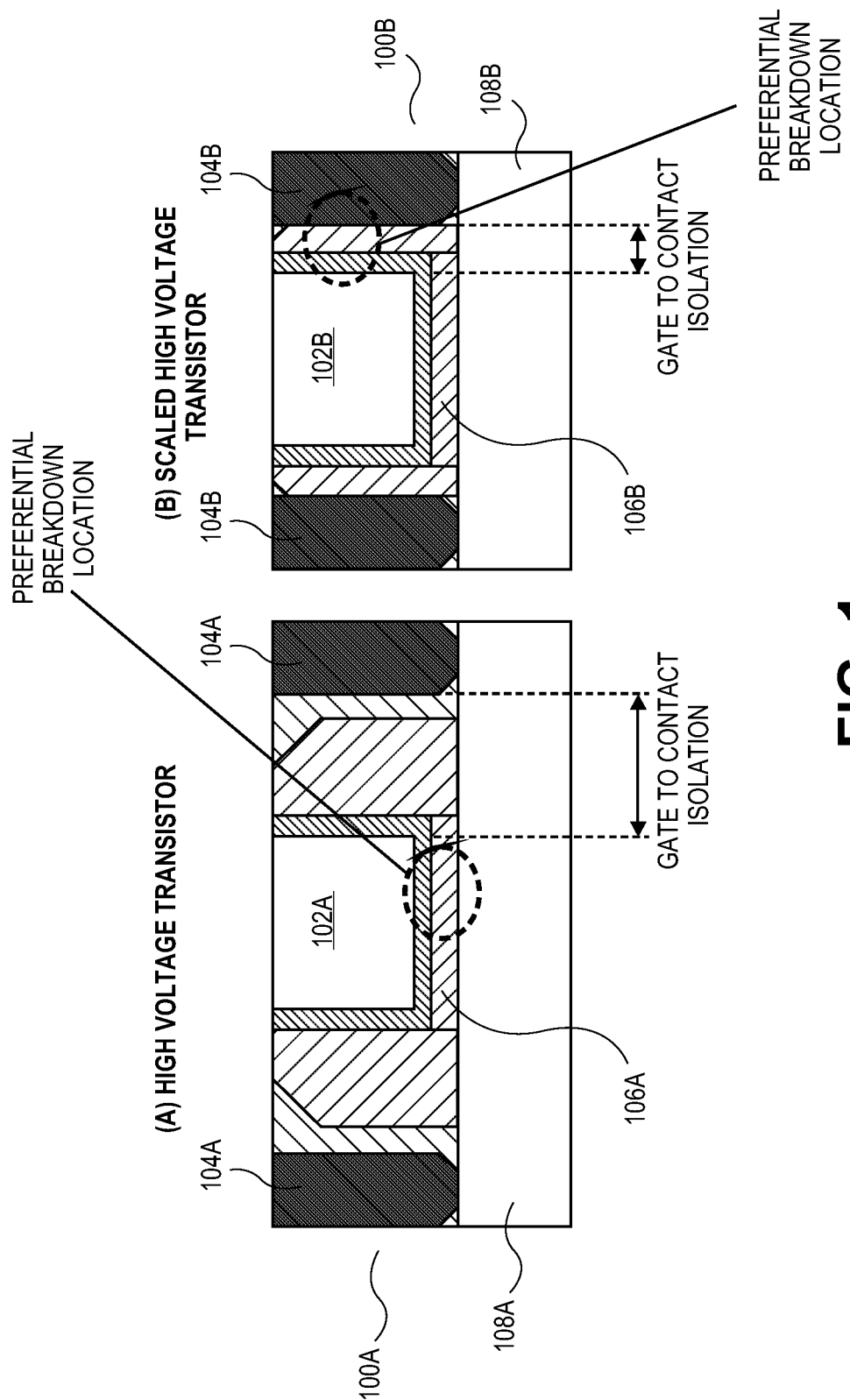
FIG. 1 illustrates cross-sectional views of (A) a standard high voltage transistor and (B) a scaled high voltage transistor, in accordance with an embodiment of the present invention.
Figure 2A:
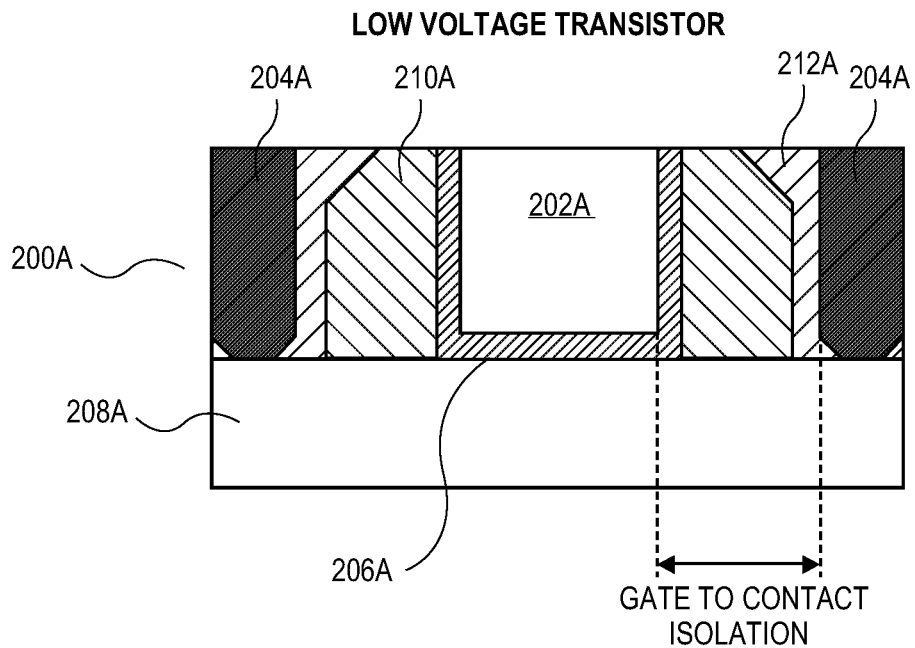
FIG. 2A illustrates a cross-sectional view of a standard low voltage transistor.
Figure 2B:
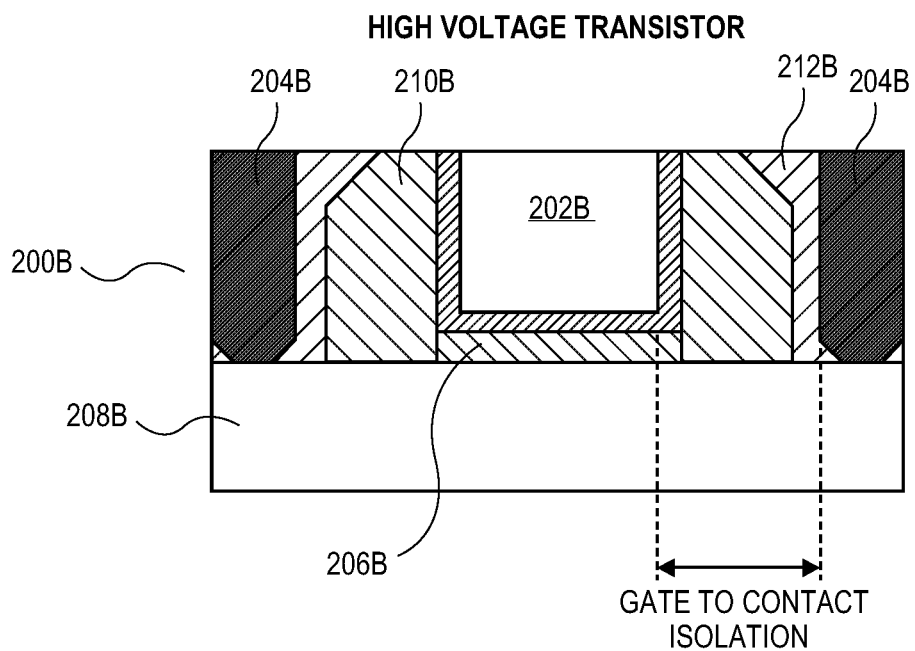
FIG. 2B illustrates a cross-sectional view of a standard high voltage transistor.
Figure 2C:
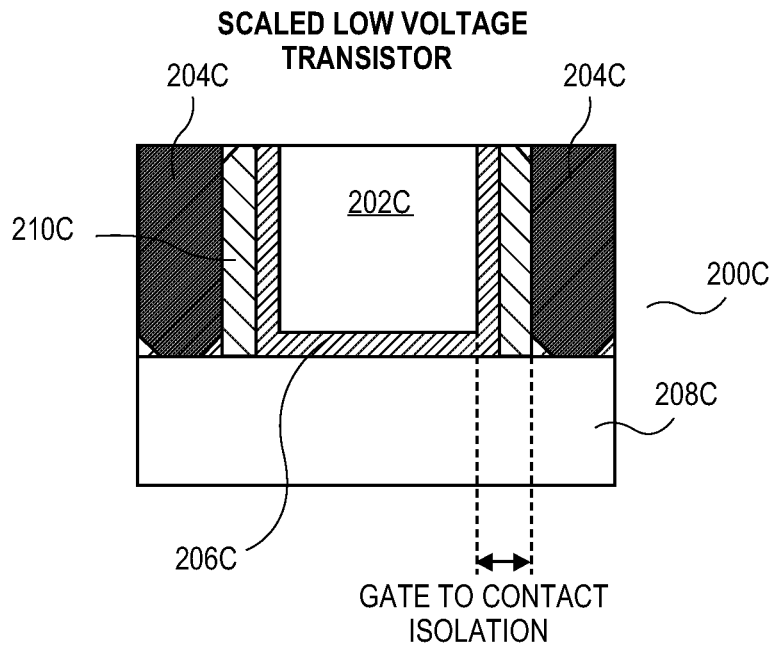
FIG. 2C illustrates a cross-sectional view of a low voltage transistor after scaling of the pitch, in accordance with an embodiment of the present invention.
Figure 2D:
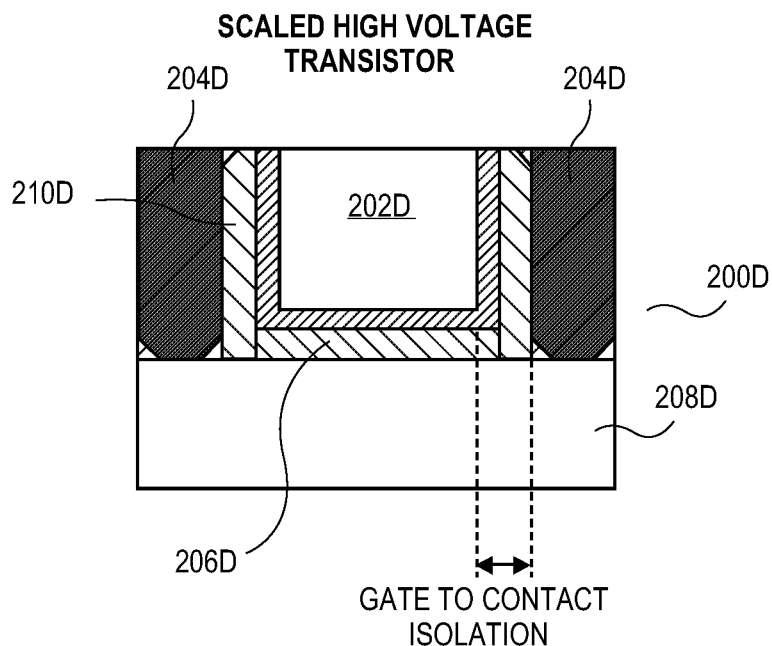
FIG. 2D illustrates a cross-sectional view of a scaled high voltage transistor, in accordance with an embodiment of the present invention.

Referring to FIG. 1, high voltage transistors 100A and 100B include gate electrodes 102A and 102B, respectively, contacts 104A and 104B, respectively, and a high voltage gate dielectric 106A and 106B, respectively, formed on a substrate 108A and 108B, respectively. As depicted in FIG. 1, there is a decrease in proximity between the gate 102B and contact 104B in the scaled device 100B (compared with device 100A) as a result of spacing. Such reduction in spacing may result in an undesirable preferential breakdown path between the gate and contact in the scaled device.

In a particular example, for illustrative purposes, 22 nm technology may support up to 1.8 Volts (V) between the gate and the source and drain (S/D) contacts reliably. However, a 3.3V non-stacked gate solution may not be supported due to premature failure between the S/D contacts and gate resulting from insufficient gate dielectric material. Thus, future nodes (e.g., the 14 nm node) may not be able to support even a 1.8V rail as supported by 22 nm technology-based devices. One solution for enabling a high-voltage device on the 14 nm node may be to substantially relax the pitch (e.g., to enables contacts to be placed farther from the gate). However, a relaxed pitch may not be compatible with scaled densities, yielding undesirable area and cost implications. As a further example of the concepts involved, FIG. 2 illustrates cross-sectional views of (A) a standard low voltage transistor 200A, (B) a standard high voltage transistor 200B, (C) a low voltage transistor 200C after scaling of the pitch, and (D) a scaled high voltage transistor 200D, in accordance with an embodiment of the present invention.

Referring to FIG. 2, low voltage transistors 200A and 200C include gate electrodes 202A and 202C, respectively, contacts 204A and 204C, respectively, a low voltage gate dielectric 206A and 206C, respectively, and spacers 210A and 210C, respectively, formed on a substrate 208A and 208C, respectively. Low voltage transistor 200A may also include some interlayer dielectric (ILD) material 212A, while low voltage transistor 200C may not. Meanwhile, high voltage transistors 200B and 200D include gate electrodes 202B and 202D, respectively, contacts 204B and 204D, respectively, a high voltage gate dielectric 206B and 206D, respectively, and spacers 210B and 210D, respectively, formed on a substrate 208B and 208D, respectively. High voltage transistor 200B may also include some ILD material 212B, while high voltage transistor 200D may not. As depicted in FIG. 2, a substantial reduction of the gate to contact spacing for scaled transistors 200C and 200D is present as compared with standard transistors 200A and 200B. Such reduction in gate to contact spacing may deleteriously impact reliability and, particularly, high voltage reliability.

Accordingly, one or more embodiments described herein enable high voltage gate to source/drain support through the fabrication of an inside spacer process. In a specific embodiment, an approach utilizes a replacement metal gate process flow to provide additional dielectric margin for scaled high voltage devices. As an example of the concepts involved, FIG. 3 illustrates cross-sectional views of (A) a standard high voltage transistor 300A, (B) a scaled high voltage transistor 300B, and (C) a scaled high voltage transistor 300C having an inner dielectric spacer, in accordance with an embodiment of the present invention.

Figure 3:
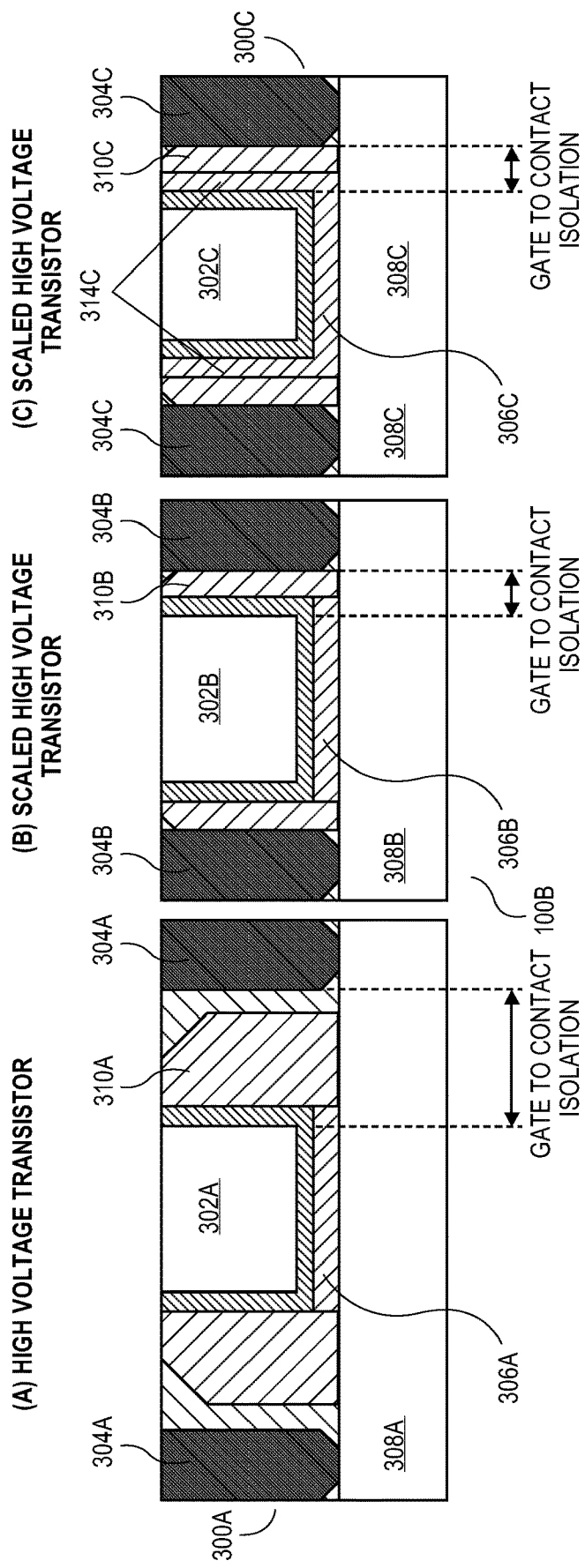
FIG. 3 illustrates cross-sectional views of (A) a standard high voltage transistor, (B) a scaled high voltage transistor, and (C) a scaled high voltage transistor having an inner dielectric spacer, in accordance with an embodiment of the present invention.

Referring to FIG. 3, high voltage transistors 300A, 300B and 300C include gate electrodes 302A, 302B and 302C, respectively, contacts 304A, 304B and 304C, respectively, a high voltage gate dielectric 306A, 306B and 306C, respectively, and spacers 310A, 310B and 310C, respectively, formed on a substrate 308A, 308B and 308C, respectively. Standard high voltage transistor 300A may also include some ILD material 312A, while scaled high voltage transistors 300B and 300C may not. Furthermore, in accordance with an embodiment of the present invention, scaled high voltage transistor 300C includes inner spacers 314C, e.g., in the form of an inner dielectric liner layer.

More specifically, referring again to FIG. 3, standard high voltage transistor 300A has a gate dielectric layer (306A) that is a hybrid composition of thermally-grown oxide and a high-k dielectric layer. The spacing between the contact 304A and the gate material 302A may include a conformally-deposited high-k dielectric layer (306A along the sidewalls), a spacer and or nitride etch stop layer (NESL) as 310A, and residual ILD oxide 312A. Scaled high voltage transistor 300B accommodates a pitch reduction that places the contacts 304B close to the gate 302B. The configuration of device 300B, while likely suitable for a low-voltage transistor, may be incompatible with high voltage operation due to poor reliability, as described above in association with FIGS. 1 and 2. In particular, referring to device 300B, as compared with 300A, the spacer 310B thickness has been decreased, and the ILD has been substantially reduced (or even eliminated, as shown). In an embodiment, as shown, the scaled high voltage transistor 300C includes a high voltage gate dielectric 306C (which is deposited to form an inside spacer 314C) in addition to a high-k dielectric layer. In one such embodiment, the deposition of two conformal layers, as opposed to only the high-k layer provides the margin needed to support reliable high-voltage operation. Thus, the configuration of 300C, as compared with 300B, increases the gate 302C to contact 304C spacing, which may required to support relatively high voltage supplies.

As such, the fabrication of a high voltage gate dielectric layer may include the formation of more than one liner dielectric layers to provide sidewall spacing between a gate material and adjacent source and/or drain contacts. As an example, FIGS. 4A-4F illustrate cross-sectional views representing various operations in a method of fabricating a semiconductor structure, the method including generating a oxide liner spacer, in accordance with an embodiment of the present invention.

Figure 4A:
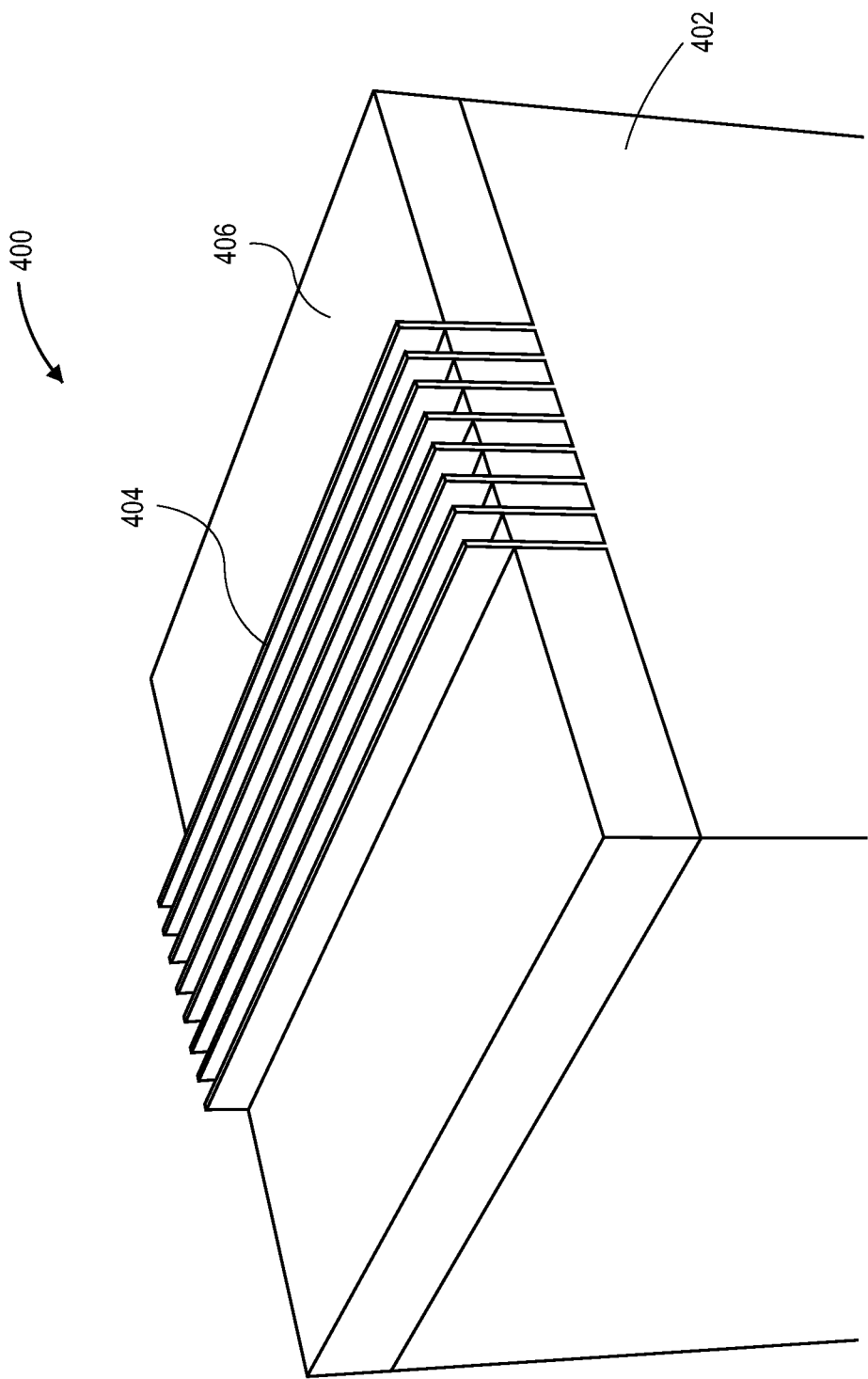

Referring to FIG. 4A, a starting structure 400 includes a plurality of fins 404 (e.g., three-dimensional semiconductor bodies) formed above a substrate 402. The fins are separated by an isolation dielectric layer 406.

In an embodiment, the plurality of fins 404 is formed from a bulk substrate 402, as depicted in FIG. 4A. In one such example, bulk substrate 402 and, hence, the plurality of fins 404 may be composed of a semiconductor material that can withstand a manufacturing process and in which charge can migrate. In an embodiment, bulk substrate 402 is composed of a crystalline silicon, silicon/germanium or germanium layer doped with a charge carrier, such as but not limited to phosphorus, arsenic, boron or a combination thereof. In one embodiment, the concentration of silicon atoms in bulk substrate 402 is greater than 97%. In another embodiment, bulk substrate 402 is composed of an epitaxial layer grown atop a distinct crystalline substrate, e.g. a silicon epitaxial layer grown atop a boron-doped bulk silicon mono-crystalline substrate. Bulk substrate 402 may alternatively be composed of a group III-V material. In an embodiment, bulk substrate 402 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 402 is composed of a III-V material and the charge-carrier dopant impurity atoms are ones such as, but not limited to, carbon, silicon, germanium, oxygen, sulfur, selenium or tellurium. In an embodiment, bulk substrate 402 and, hence, the plurality of fins 404 is undoped or only lightly doped. In an embodiment, at least a portion of each of the plurality of fins 404 is strained, either at this stage or at a later stage.

Alternatively, the substrate includes an upper epitaxial layer and a lower bulk portion, either of which may be composed of a single crystal of a material which may include, but is not limited to, silicon, germanium, silicon-germanium or a III-V compound semiconductor material. An intervening insulator layer composed of a material which may include, but is not limited to, silicon dioxide, silicon nitride or silicon oxy-nitride may be disposed between the upper epitaxial layer and the lower bulk portion.

Isolation dielectric layer 406 may be composed of a material suitable to ultimately electrically isolate, or contribute to the isolation of, a permanent gate structure from an underlying bulk substrate. For example, in one embodiment, the isolation dielectric layer 406 is composed of a dielectric material such as, but not limited to, silicon dioxide, silicon oxy-nitride, silicon nitride, or carbon-doped silicon nitride. It is to be understood that a global layer may be formed and then recessed to ultimately expose the active portions of the plurality of fins 404.

Figure 4B:
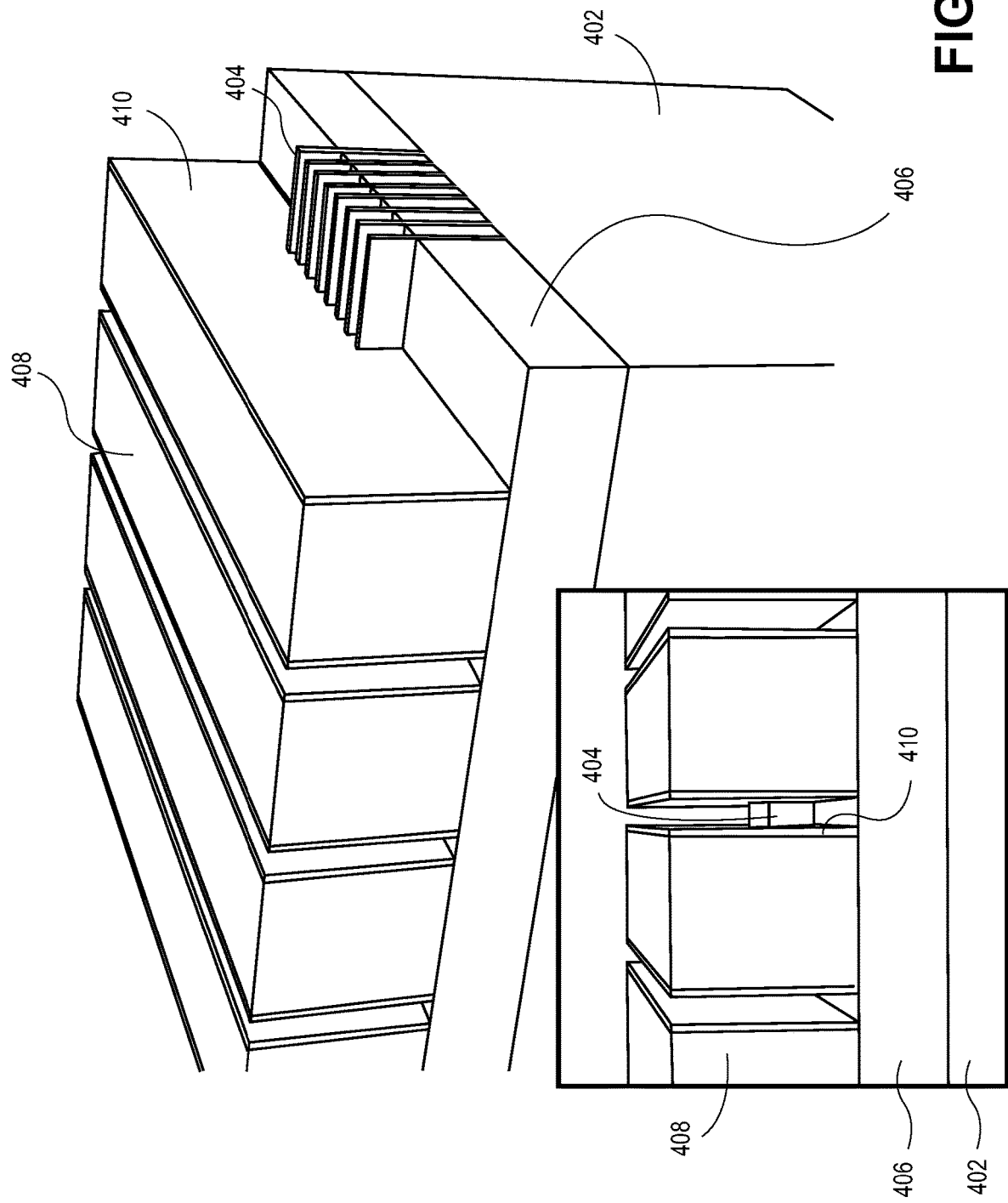

Referring to FIG. 4B, a plurality of dummy gate structures 408, such as polysilicon gate structures, are formed orthogonal to the plurality of fins 404 and above or on isolation dielectric layer 406. Spacers 410 are formed adjacent the sidewalls of each of the plurality of dummy gate structures 408. The inset to FIG. 4B provides a view with the gate structures running into and out of the page. Doped tips and/or source and drain regions may be formed in the plurality of fins 404 at this stage, using the plurality of dummy gate structures 408 and spacers 410 as a mask during doping operations.

Dummy gate structures 408 are, in an embodiment, composed of a material suitable for removal at a replacement gate operation, as described below. In one embodiment, dummy gates structures 408 are composed of polycrystalline silicon, amorphous silicon, silicon dioxide, silicon nitride, or a combination thereof. In another embodiment, a protective capping layer (not shown), such as a silicon dioxide or silicon nitride layer, is formed above dummy gates structures 408. In an embodiment, an underlying dummy gate dielectric layer (also not shown) is included. In an embodiment, dummy gates structures 408.

Spacers 410 may be composed of a material suitable to ultimately electrically isolate, or contribute to the isolation of, a permanent gate structure from adjacent conductive contacts. For example, in one embodiment, the spacers 410 are composed of a dielectric material such as, but not limited to, silicon dioxide, silicon oxy-nitride, silicon nitride, or carbon-doped silicon nitride.

As mentioned above, dopant or diffusion regions may be formed in the fins. Such dopant or diffusion regions are, in one embodiment, heavily doped regions of the plurality of fins 404. In one embodiment, the plurality of fins 404 is composed of a group IV material and one or more portions are doped with boron, arsenic, phosphorus, indium or a combination thereof. In another embodiment, the plurality of fins 404 is composed of a group III-V material and one or more portions are doped with carbon, silicon, germanium, oxygen, sulfur, selenium or tellurium.

Figure 4C:
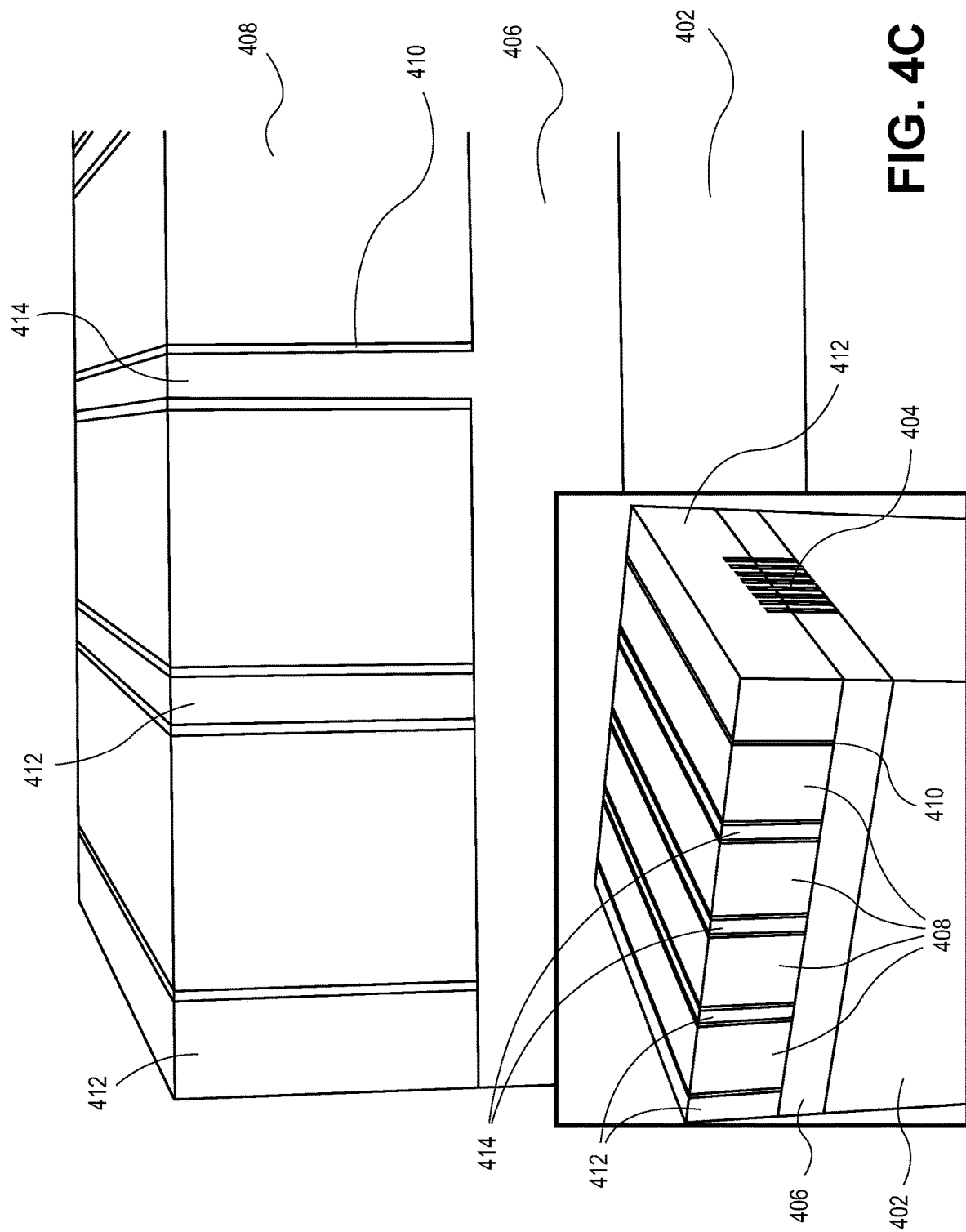

Referring to FIG. 4C, contacts 412 (e.g., metal contacts) and/or isolation regions 414 (e.g., an oxide, nitride or carbide dielectric material) are formed between gates of the plurality of dummy gate structures 408 and spacers 410. The positioning of contacts 412 and isolation regions 414 may be layout dependent. The inset to FIG. 4C provides a broader view of such an arrangement of contacts 412 and isolation regions 414, in accordance with an embodiment. It is to be understood that the contacts 412 at this stage may alternatively be dummy contacts (e.g., a dummy dielectric material) that are later replaced with a metal contact material.

In an embodiment, the contacts 412 are formed by deposition and planarization, e.g., by CMP, of a conductive material. Contacts 412 may be composed of a conductive material. In an embodiment, contacts 412 are composed of a metal species. The metal species may be a pure metal, such as nickel or cobalt, or may be an alloy such as a metal-metal alloy or a metal-semiconductor alloy (e.g., such as a silicide material).

Isolation regions 414 may be composed of a material suitable to ultimately electrically isolate, or contribute to the isolation of, a permanent gate structure from other gate structures or contact structures. For example, in one embodiment, the isolation dielectric regions 414 are composed of a dielectric material such as, but not limited to, silicon dioxide, silicon oxy-nitride, silicon nitride, or carbon-doped silicon nitride.

Figure 4D:
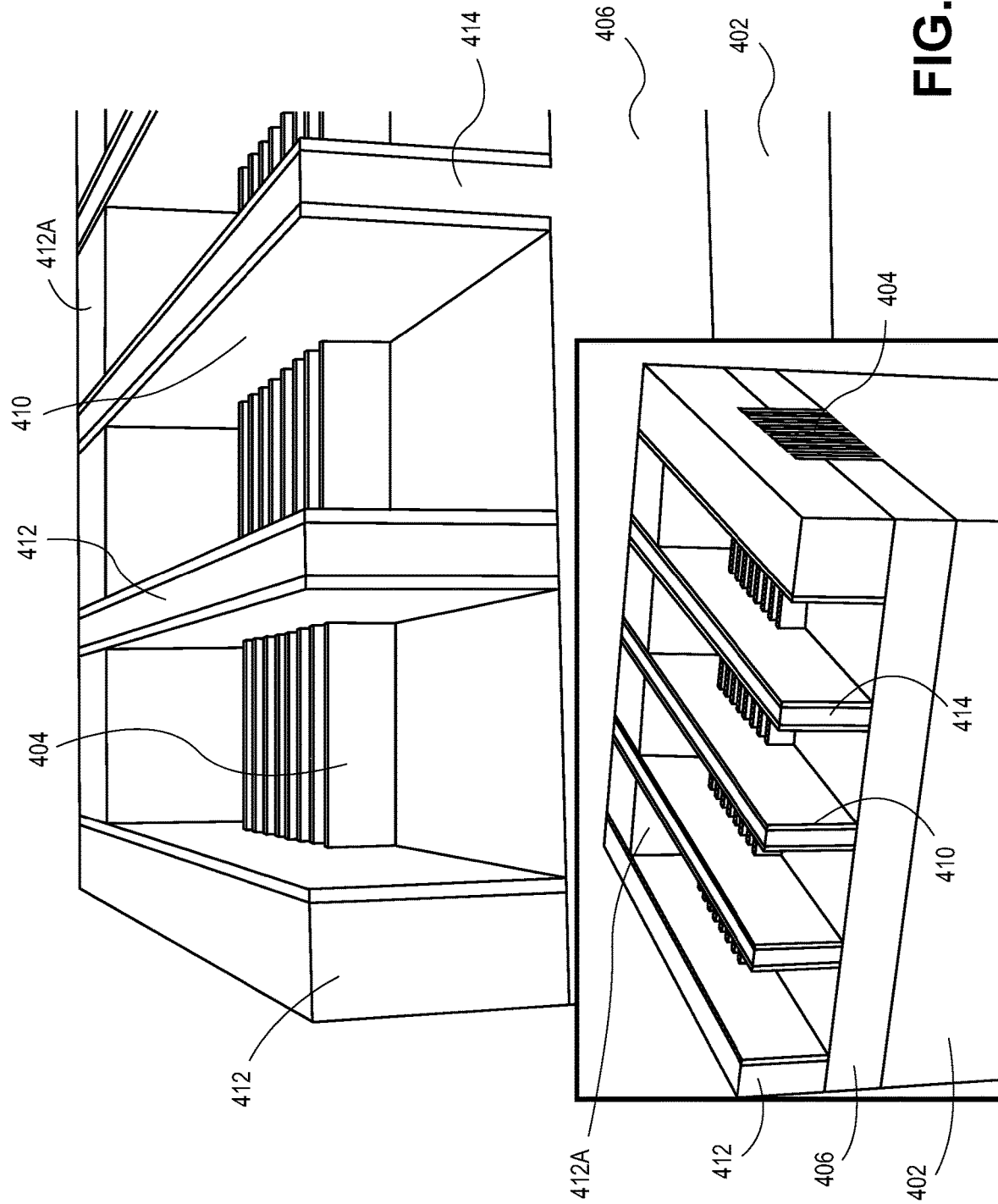

Referring to FIG. 4D, the plurality of dummy gates 408 is removed, leaving contacts 412, isolation regions 414 and spacers 410, and exposing the plurality of fins 404 and the isolation dielectric layer 406. The inset to FIG. 4D corresponds with the inset to FIG. 4C. Contact regions 412A orthogonal to the previous positioning of dummy gates 408 are also depicted.

Thus, the exposed plurality of dummy gates 408 may ultimately be replaced in a replacement gate process scheme. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing.

In an embodiment, the plurality of dummy gates 408 is removed by a dry etch or wet etch process. In one embodiment, the plurality of dummy gates 408 is composed of polycrystalline silicon or amorphous silicon and is removed with a dry etch process comprising $SF_6$. In another embodiment, the plurality of dummy gates 408 is composed of polycrystalline silicon or amorphous silicon and is removed with a wet etch process comprising aqueous $NH_4OH$ or tetramethylammonium hydroxide. In one embodiment, the plurality of dummy gates 408 is composed of silicon nitride and is removed with a wet etch comprising aqueous phosphoric acid.

Referring to FIG. 4E, an inside spacer dielectric liner 416 (e.g., an inside spacer oxide liner) is formed conformal to the structure of FIG. 4D. The inset to FIG. 4E corresponds with the inset to FIG. 4D.

In an embodiment, the inside spacer dielectric liner 416 is a high quality, electrical gate oxide formed by atomic layer deposition (ALD) or other conformal oxide liner deposition. In one such embodiment, the inside spacer dielectric liner is a silicon oxide (e.g., $SiO_2$) material layer. As illustrated in FIG. 4E, an increase in effective spacer thickness is achieved by use of the inside spacer dielectric liner 416. As is also illustrated, since the inside spacer dielectric liner 416 is deposited using atomic layer (or other conformal) deposition, the inside spacer dielectric liner 416 not only covers the exposed fins 404, but the sidewall of the spacers 410 as well. In one embodiment, the spacer 410 material is very thin and of poor electrical quality (with a lower breakdown voltage than an equivalent thickness of electrical oxide) and, so, the presence of the inside spacer dielectric liner 416 provides a much improved electrical barrier. By depositing a high-quality oxide with ALD to line the spacer sidewall, the breakdown voltage of the spacer material may be increased beyond the gate-to-body breakdown voltage. In one such embodiment, such a configuration is suitable for an intrinsically-reliable transistor. Significantly, as compared with a thermal $SiO_2$ process which would utilize fin consumption to fabricate a thick oxide layer, deposition of the inside spacer dielectric liner 416 consumes little to none of the fin silicon.

Following formation of the inside spacer dielectric liner 416, although not depicted, dual gate oxide formation may be performed. Specifically, the fabrication of a thin gate dielectric transistor (e.g., a low voltage transistor) involves, following formation of inside spacer dielectric liner 416 in all device locations, a masking of locations of thick gate dielectric transistors (e.g., high voltage transistors) while exposing the locations of the low voltage transistors. An etch process is performed to remove portions of the inside spacer dielectric liner 416 in locations where low voltage devices will be fabricated. Then, the locations of the high voltage devices are re-exposed by mask removal and a second gate dielectric layer, e.g., a high-k gate dielectric layer, is formed in all locations. Thus, in an embodiment, low voltage transistors include the second gate dielectric layer but not the inside spacer dielectric liner 416, while high voltage transistors include both the second gate dielectric layer and the inside spacer dielectric liner 416.

In an embodiment, the second gate dielectric layer is composed of a high-K material. For example, in one embodiment, the second gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of the second gate dielectric layer may include a thin layer of thermal oxide (e.g., 1-2 monolayers) formed from the top few layers of the fins 404 in locations where the inside spacer dielectric liner 416 has been removed, e.g., in region of the low voltage devices. In an embodiment, the second gate dielectric layer is composed of a top high-k portion and a lower portion composed of an oxide of a semiconductor material. In one embodiment, the second gate dielectric layer is composed of a top portion of hafnium oxide and a bottom portion of silicon dioxide or silicon oxy-nitride.

Referring to FIG. 4F, a plurality of permanent gate electrodes 418 (e.g., metal gate electrodes) is formed in the openings formed upon removal of the plurality of dummy gates 408, and on or above the inside spacer dielectric liner 416. The metal permanent gate material along with the inside spacer dielectric liner 416 may be planarized to re-expose the contacts 412, isolation regions 414 and (possible) the spacers 410, as depicted in FIG. 4F. The inset to FIG. 4F corresponds with the inset to FIG. 4E.

In an embodiment, the metal permanent gate material along with the inside spacer dielectric liner 416 are planarized by a chemical mechanical planarization (CMP) process operation. In one such embodiment, the CMP process operation involves polishing the metal permanent gate material and the inside spacer dielectric liner 416 on a polishing pad using a slurry. In another embodiment, a dry etch process is used.

In an embodiment, plurality of permanent gate electrodes 418 is composed of a metal material. In one such embodiment, the plurality of permanent gate electrodes 418 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the plurality of permanent gate electrodes 418 is composed of a non-workfunction-setting fill material formed above a metal workfunction-setting layer. In an embodiment, the plurality of permanent gate electrodes 418.

The processes described above may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET.

Overall, the difficulty of high-voltage and/or analog circuitry scaling may become more and more evident as the pitches continue to decrease and become discretized due to patterning restrictions. The above described implementation may be useful for a process that implements multiple voltage supplies in circuit designs, e.g., in SoC products at the 22 nm node or less.

In a specific implementation, in an embodiment, a nominal oxide thickness for a 1.8V transistor is approximately 3.5-4 nm. For high voltage technology, there is substantial margin between the gate and S/D contacts (e.g., 35 nm), enabling the preferred breakdown path to occur between the gate and the body. On subsequent nodes, the gate to contact margin is reduced to approximately 4-7 nm. The 4-7 nm of dielectric isolating the gate from the contact may not be as high quality of an oxide as the 3.5-4 nm gate dielectric isolating the gate from the channel and, therefore, presents a risk for reliability. The same transistor having an addition oxide liner, as described above, provides a margin between gate and contact that is improved by the addition of approximately 2.5-3.5 nm atomic layer deposition (ALD) gate oxide dielectric, improving the contact to gate spacing to greater than approximately 7-10 nm.

In association with an embodiment, matched transistor performance of a device including an oxide-liner high-voltage transistor is achieved as compared with a conventional replacement gate integration scheme. In association with one embodiment, reliability results shown indicate a substantial improvement in a shape factor for an oxide liner thick-gate flow compared with a standard flow. In association with an embodiment, thick-gate NMOS reliability data indicates improvement in shape factor utilizing an oxide liner flow. Breakdown events may occur over a smaller voltage range, reducing the failure distribution versus time and voltage compared to a standard flow.

Perhaps more generally, one or more embodiments of the present invention are directed to a gate aligned contact process. Such a process may be implemented to form contact structures for semiconductor structure fabrication, e.g., for integrated circuit fabrication. In an embodiment, a contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separately patterning of contacts and contact plugs.

Again, in a more general aspect, in accordance with one or more embodiments described herein, a method of contact formation involves formation of a contact pattern which is perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Figure 5:
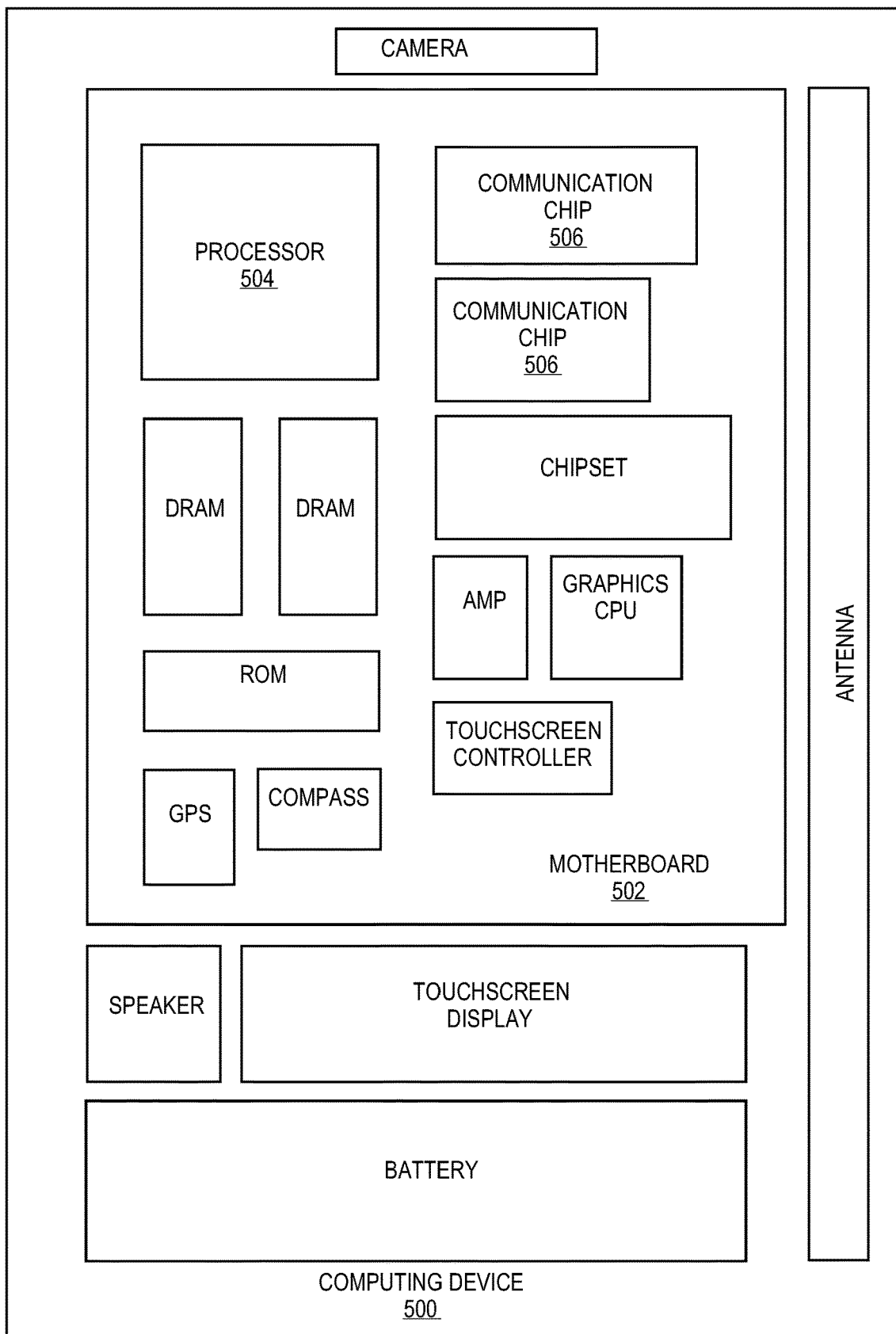
FIG. 5 illustrates a computing device in accordance with one implementation of the invention.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor includes one or more devices, such as MOS-FET transistors built in accordance with implementations of the invention. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip includes one or more devices, such as MOS-FET transistors built in accordance with implementations of the invention.

In further implementations, another component housed within the computing device 500 may contain an integrated circuit die that includes one or more devices, such as MOS-FET transistors built in accordance with implementations of the invention.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Thus, embodiments of the present invention include high voltage three-dimensional devices having dielectric liners and methods of forming high voltage three-dimensional devices having dielectric liners.

In an embodiment, a semiconductor structure includes a first fin active region and a second fin active region disposed above a substrate. A first gate structure is disposed above a top surface of, and along sidewalls of, the first fin active region. The first gate structure includes a first gate dielectric, a first gate electrode, and first spacers. The first gate dielectric is composed of a first dielectric layer disposed on the first fin active region and along sidewalls of the first spacers, and a second, different, dielectric layer disposed on the first dielectric layer and along sidewalls of the first spacers. The semiconductor structure also includes a second gate structure disposed above a top surface of, and along sidewalls of, the second fin active region. The second gate structure includes a second gate dielectric, a second gate electrode, and second spacers. The second gate dielectric is composed of the second dielectric layer disposed on the second fin active region and along sidewalls of the second spacers.

In one embodiment, the first fin active region and the second fin active region are disposed directly on the substrate.

In one embodiment, the substrate is a bulk single crystalline silicon substrate, and the first fin active region and the second fin active region are composed of single crystalline silicon.

In one embodiment, the first dielectric layer is composed of silicon oxide, and the second dielectric layer is composed of a high-k material.

In one embodiment, the second fin active region, but not the first fin active region, includes a thin layer of thermal oxide at a top surface of the fin active region.

In one embodiment, the semiconductor structure further includes a first pair of contacts disposed directly adjacent to the first spacers, and a second pair of contacts disposed directly adjacent to the second spacers.

In one embodiment, the first and second gate electrodes are metal gate electrodes.

In one embodiment, the semiconductor structure further includes a high voltage device including the first gate structure, and a low voltage device including the second gate structure.

In an embodiment, a semiconductor structure includes a first plurality of fin active regions and a second plurality of fin active regions disposed above a substrate. The semiconductor structure also includes a high voltage device having a first gate dielectric and a first gate electrode. The first gate dielectric is composed of a first dielectric layer disposed on the first plurality of fin active regions and along sidewalls of the first gate electrode and a second, different, dielectric layer disposed on the first dielectric layer and along sidewalls of the first gate electrode. The semiconductor structure also includes a low voltage device having a second gate dielectric and a second gate electrode. The second gate dielectric is composed of the second dielectric layer disposed on the second plurality of fin active regions and along sidewalls of the second gate electrode.

In one embodiment, the first plurality of fin active regions and the second plurality of fin active regions are disposed directly on the substrate.

In one embodiment, the substrate is a bulk single crystalline silicon substrate, and the first plurality of fin active regions and the second plurality of fin active regions are composed of single crystalline silicon.

In one embodiment, the first dielectric layer is composed of silicon oxide, and the second dielectric layer is composed of a high-k material.

In one embodiment, the second plurality of fin active regions, but not the first plurality of fin active regions, includes a thin layer of thermal oxide at a top surface of the plurality of fin active regions.

In one embodiment, the semiconductor structure further includes a first pair of contacts disposed directly adjacent to the first spacers, and a second pair of contacts disposed directly adjacent to the second spacers.

In one embodiment, the first and second gate electrodes are metal gate electrodes.

In an embodiment, a method of fabricating a semiconductor structure includes forming a first plurality of first fin active regions and a second plurality of fin active regions above a substrate. A plurality of dummy gate structures is formed above the first and second pluralities of fin active regions. Spacers are formed adjacent the sidewalls of each of the plurality of dummy gate structures. The dummy gate structures are removed to form a plurality of gate locations defined by the spacers. A first conformal dielectric layer is formed in the plurality of gate locations. The first conformal dielectric layer is removed from a first of the plurality of gate locations, but not from a second of the plurality of gate locations. Subsequently, a second conformal dielectric layer is formed in the plurality of gate locations. Subsequently, a low voltage device is formed in the first of the plurality of gate locations and a high voltage device is formed in the second of the plurality of gate locations.

In one embodiment, the first plurality of fin active regions and the second plurality of fin active regions are formed directly on the substrate.

In one embodiment, the substrate is a bulk single crystalline silicon substrate, and the first plurality of fin active regions and the second plurality of fin active regions are formed from the bulk single crystalline silicon substrate.

In one embodiment, the first dielectric layer is composed of silicon oxide, and the second dielectric layer is composed of a high-k material.

In one embodiment, the method further includes forming a thin layer of thermal oxide at a top surface of the plurality of second fin active regions but not the first plurality of fin active regions.

In one embodiment, the method further includes forming a first pair of contacts directly adjacent to the first spacers, and forming a second pair of contacts directly adjacent to the second spacers.

In one embodiment, forming the low and high voltage devices comprises forming metal gate electrodes.

In one embodiment, forming the second conformal dielectric layer comprises using atomic layer deposition (ALD) to form both layers.

What is claimed is:
1. An integrated circuit structure, comprising:
   a highvoltage transistor comprising:
      a gate electrode over a semiconductor fin, the gate electrode having a first side opposite a second side;
      a first gate dielectric between the semiconductor fin of the high voltage transistor and the gate electrode of the high voltage transistor, wherein the first gate dielectric comprises a first high-k dielectric layer, and wherein the first high-k dielectric layer is further along the first side and the second side of the gate electrode of the high voltage transistor; and
      a first source or drain region at the first side of the gate electrode; and
      a second source or drain region at the second side of the gate electrode; and
   a low voltage transistor comprising:
      a gate electrode over a semiconductor fin, the gate electrode having a first side opposite a second side;
      a second gate dielectric between the semiconductor fin of the low voltage transistor and the gate electrode of the low voltage transistor, wherein the second gate dielectric comprises a second high-k dielectric layer, and wherein the second high-k dielectric layer is further along the first side and the second side of the gate electrode of the low voltage transistor; and a first source or drain region at the first side of the gate electrode of the high voltage transistor; and a second source or drain region at the second side of the gate electrode; and a first dielectric spacer adjacent to and in direct contact with the first high-k dielectric layer along the first side of the gate electrode, the first dielectric spacer having a first lateral thickness;

a second dielectric spacer adjacent to and in direct contact with the first high-k dielectric layer along the second side of the gate electrode, the first dielectric spacer having the first lateral thickness;

a third dielectric spacer adjacent to and in direct contact with the second high-k dielectric layer along the first side of the gate electrode of the low voltage transistor, the third dielectric spacer having a second lateral thickness, the second lateral thickness less than the first lateral thickness; and a fourth dielectric spacer adjacent to and in direct contact with the second high-k dielectric layer along the second side of the gate electrode of the low voltage transistor, the fourth dielectric spacer having the second lateral thickness.

2. The integrated circuit structure of claim 1, further comprising:
a fifth dielectric spacer adjacent to and in direct contact with the first dielectric spacer; and
a sixth dielectric spacer adjacent to and in direct contact with the second dielectric spacer.

3. The integrated circuit structure of claim 1, further comprising:
a first conductive contact on the first source or drain region of the high voltage transistor;
a first dielectric material between the first conductive contact and the first dielectric spacer, the first dielectric material having a composition different than the first dielectric spacer;
a second conductive contact on the second source or drain region of the high voltage transistor; and
a second dielectric material between the second conductive contact and the second dielectric spacer, the second dielectric material having a composition different than the second dielectric spacer.

4. The integrated circuit structure of claim 3, further comprising:
a third conductive contact on the first source or drain region of the low voltage transistor, wherein the third dielectric spacer is in direct contact with the third conductive contact; and
a fourth conductive contact on the second source or drain region of the low voltage transistor, wherein the fourth dielectric spacer is in direct contact with the fourth conductive contact.

5. The integrated circuit structure of claim 1, wherein the semiconductor fin of the high voltage transistor comprises single crystalline silicon, and wherein the semiconductor fin of the low voltage transistor comprises single crystalline silicon.

6. The integrated circuit structure of claim 1, wherein the gate electrode of the high voltage transistor comprises a metal, and wherein the gate electrode of the high voltage transistor comprises a metal.

7. The integrated circuit structure of claim 1, wherein the first high-k dielectric layer has a thickness approximately the same as a thickness of the second high-k dielectric layer.

8. The integrated circuit structure of claim 7, wherein the first gate dielectric comprises a first layer comprising silicon and oxygen, the first layer comprising silicon and oxygen between the semiconductor fin of the high voltage transistor and the first high-k dielectric layer, and wherein the second gate dielectric comprises a second layer comprising silicon and oxygen, the second layer comprising silicon and oxygen between the semiconductor fin of the low voltage transistor and the second high-k dielectric layer.

9. The integrated circuit structure of claim 8, wherein the first layer comprising silicon and oxygen has a thickness greater than a thickness of the second layer comprising silicon and oxygen.

10. An integrated circuit structure, comprising:
a highvoltage transistor comprising:
a gate electrode over a semiconductor body, the gate electrode having a first side opposite a second side;
a first gate dielectric between the semiconductor body of the high voltage transistor and the gate electrode of the high voltage transistor, wherein the first gate dielectric comprises a first high-k dielectric layer, and wherein the first high-k dielectric layer is further along the first side and the second side of the gate electrode of the high voltage transistor; and
a first source or drain region at the first side of the gate electrode; and
a second source or drain region at the second side of the gate electrode; and
a low voltage transistor comprising:
a gate electrode over a semiconductor body, the gate electrode having a first side opposite a second side;
a second gate dielectric between the semiconductor body of the low voltage transistor and the gate electrode of the low voltage transistor, wherein the second gate dielectric comprises a second high-k dielectric layer, and wherein the second high-k dielectric layer is further along the first side and the second side of the gate electrode of the low voltage transistor; and
a first source or drain region at the first side of the gate electrode of the high voltage transistor; and
a second source or drain region at the second side of the gate electrode; and
a first dielectric spacer adjacent to and in direct contact with the first high-k dielectric layer along the first side of the gate electrode, the first dielectric spacer having a first lateral thickness;
a second dielectric spacer adjacent to and in direct contact with the first high-k dielectric layer along the second side of the gate electrode, the first dielectric spacer having the first lateral thickness;
a third dielectric spacer adjacent to and in direct contact with the second high-k dielectric layer along the first side of the gate electrode of the low voltage transistor, the third dielectric spacer having a second lateral thickness, the second lateral thickness less than the first lateral thickness; and
a fourth dielectric spacer adjacent to and in direct contact with the second high-k dielectric layer along the second side of the gate electrode of the low voltage transistor, the fourth dielectric spacer having the second lateral thickness.

11. The integrated circuit structure of claim 10, further comprising:
a fifth dielectric spacer adjacent to and in direct contact with the first dielectric spacer; and a sixth dielectric spacer adjacent to and in direct contact with the second dielectric spacer.

12. The integrated circuit structure of claim 10, further comprising:
a first conductive contact on the first source or drain region of the high voltage transistor;
a first dielectric material between the first conductive contact and the first dielectric spacer, the first dielectric material having a composition different than the first dielectric spacer;
a second conductive contact on the second source or drain region of the high voltage transistor; and
a second dielectric material between the second conductive contact and the second dielectric spacer, the second dielectric material having a composition different than the second dielectric spacer.

13. The integrated circuit structure of claim 12, further comprising:
a third conductive contact on the first source or drain region of the low voltage transistor, wherein the third dielectric spacer is in direct contact with the third conductive contact; and
a fourth conductive contact on the second source or drain region of the low voltage transistor, wherein the fourth dielectric spacer is in direct contact with the fourth conductive contact.

14. The integrated circuit structure of claim 10, wherein the semiconductor body of the high voltage transistor comprises single crystalline silicon, and wherein the semiconductor body of the low voltage transistor comprises single crystalline silicon.

15. The integrated circuit structure of claim 10, wherein the gate electrode of the high voltage transistor comprises a metal, and wherein the gate electrode of the high voltage transistor comprises a metal.

16. The integrated circuit structure of claim 10, wherein the first high-k dielectric layer has a thickness approximately the same as a thickness of the second high-k dielectric layer.

17. The integrated circuit structure of claim 16, wherein the first gate dielectric comprises a first layer comprising silicon and oxygen, the first layer comprising silicon and oxygen between the semiconductor body of the high voltage transistor and the first high-k dielectric layer, and wherein the second gate dielectric comprises a second layer comprising silicon and oxygen, the second layer comprising silicon and oxygen between the semiconductor body of the low voltage transistor and the second high-k dielectric layer.

18. The integrated circuit structure of claim 17, wherein the first layer comprising silicon and oxygen has a thickness greater than a thickness of the second layer comprising silicon and oxygen.

19. A computing device, comprising:
a board; and
a processor coupled to the board, the processor comprising: a high voltage transistor comprising:
a highvoltage transistor comprising:
  a gate electrode over a semiconductor fin, the gate electrode having a first side opposite a second side;
  a first gate dielectric between the semiconductor fin of the high voltage transistor and the gate electrode of the high voltage transistor, wherein the first gate dielectric comprises a first high-k dielectric layer, and wherein the first high-k dielectric layer is further along the first side and the second side of the gate electrode of the high voltage transistor; and
  a first source or drain region at the first side of the gate electrode; and
  a second source or drain region at the second side of the gate electrode; and
a low voltage transistor comprising:
  a gate electrode over a semiconductor fin, the gate electrode having a first side opposite a second side;
  a second gate dielectric between the semiconductor fin of the low voltage transistor and the gate electrode of the low voltage transistor, wherein the second gate dielectric comprises a second high-k dielectric layer, and wherein the second high-k dielectric layer is further along the first side and the second side of the gate electrode of the low voltage transistor; and
  a first source or drain region at the first side of the gate electrode of the high voltage transistor; and
  a second source or drain region at the second side of the gate electrode; and
  a first dielectric spacer adjacent to and in direct contact with the first high-k dielectric layer along the first side of the gate electrode, the first dielectric spacer having a first lateral thickness;
  a second dielectric spacer adjacent to and in direct contact with the first high-k dielectric layer along the second side of the gate electrode, the first dielectric spacer having the first lateral thickness;
  a third dielectric spacer adjacent to and in direct contact with the second high-k dielectric layer along the first side of the gate electrode of the low voltage transistor, the third dielectric spacer having a second lateral thickness, the second lateral thickness less than the first lateral thickness; and
  a fourth dielectric spacer adjacent to and in direct contact with the second high-k dielectric layer along the second side of the gate electrode of the low voltage transistor, the fourth dielectric spacer having the second lateral thickness.

20. The computing device of claim 10, wherein the processer further comprises a communications chip.

* * * * *